US012800650B2

(12) United States Patent
Hung et al.

(10) Patent No.: US 12,800,650 B2
(45) Date of Patent: Nov. 17, 2026

(54) GROUND-SIGNAL-GROUND DEVICE STRUCTURE

(71) Applicant: UNITED MICROELECTRONICS CORP., Hsin-Chu City (TW)

(72) Inventors: Ching-Wen Hung, Tainan City (TW); Jinn-Horng Lai, Miaoli County (TW); Yan-Zung Wang, Tainan City (TW); Peng-Hsiu Chen, Tainan City (TW); Su-Ming Hsieh, Tainan City (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 489 days.

(21) Appl. No.: 18/116,272

(22) Filed: Mar. 1, 2023

(65) Prior Publication Data

US 2024/0264224 A1 Aug. 8, 2024

(30) Foreign Application Priority Data

Feb. 3, 2023 (CN) ......................... 202310079297.4

(51) Int. Cl.
*G01R 31/28* (2006.01)
*H10W 20/40* (2026.01)

(52) U.S. Cl.
CPC ........ *G01R 31/2886* (2013.01); *H10W 20/40* (2026.01)

(58) Field of Classification Search
CPC ..................................................... H01L 23/485
See application file for complete search history.

(56) References Cited

U.S. PATENT DOCUMENTS 9,887,668 B2 2/2018 Zampardi
2002/0097110 A1* 7/2002 Khan ...................... H01P 5/028 333/32
2006/0022678 A1* 2/2006 Hegazy .............. G01R 31/2853 257/E23.142
2009/0108369 A1* 4/2009 Chu .................... H10W 20/423 257/E47.001
2011/0151596 A1* 6/2011 Cho ..................... G01R 35/007 257/E21.529
2013/0093451 A1* 4/2013 Cho ....................... G01R 31/26 324/756.01
2013/0256849 A1* 10/2013 Danny .................... H01P 5/107 257/664
2014/0278197 A1* 9/2014 Yen .................... G01R 31/2607 324/762.01
2016/0322385 A1 11/2016 Fuh
2019/0139889 A1* 5/2019 Ding ................... H10W 20/496
2020/0132721 A1* 4/2020 Kim ................... G01R 1/07378
2020/0343194 A1* 10/2020 Yong ....................... H01L 23/66
2020/0373254 A1* 11/2020 Wang .................... H02M 7/003

* cited by examiner

*Primary Examiner* — Brent A. Fairbanks
*Assistant Examiner* — Michael Anguiano
(74) *Attorney, Agent, or Firm* — Winston Hsu

(57) ABSTRACT

A ground-signal-ground (GSG) device structure is provided in the present invention, including two signal pads aligned in a first direction and two ground pads respectively at two sides of each signal pad in a second direction, and two transmission lines between the two signal pads and are connected respectively with said two signal pads, and said two transmission lines extend toward each other in the first direction and connect to a device, wherein the two signal pads and the two transmission lines are only in the level of 7th metal layer or above in back-end-of-line (BEOL) metal layers.

9 Claims, 3 Drawing Sheets

GROUND-SIGNAL-GROUND DEVICE STRUCTURE

BACKGROUND OF THE INVENTION

1. Field of the Invention

The present invention relates generally to a ground-signal-ground (GSG) device structure, and more specifically, to a GSG device structure for radio frequency metal-oxide-semiconductor (RF MOS) device.

2. Description of the Prior Art

Normal integrated circuits (IC) are manufactured on semiconductor substrate through semiconductor process. Silicon wafer is commonly used substrate in IC industry, and typical electronic device may include transistor, amplifier, resistor and capacitor, etc. Basic semiconductor devices are usually manufactured according to design specification and therefore provided with necessary electrical property or value (ex. specific gain or resistance). However, it is difficult to test individual devices after they are integrated in ICs. In lieu of testing these devices in ICs, standalone copies of these basic devices are often tested in the industry. These standalone copies are fabricated in some separate regions of the surface of the wafer not occupied by dies or ICs formed on the wafer. Since these standalone copies are fabricated using the same process (and typically during the same process) as normal devices, it may be assumed that they may be provided with the same gains, resistances or other electrical properties similar to corresponding devices or circuits.

During the aforementioned in-process electrical testing, a signal source and a measurement tool are electrically connected to the standalone copies to be tested (may be referred as device under tests, DUTs), for example through micro-probes contacting probe pads to establish electrical connection with DUTs. Measurement tool can measure various responses or electrical parameters of the DUTs by outputting signals. However in certain situations, the conductive lines connecting to the DUTs may hinder the measurement of electrical property since these conductive lines exhibit their own physical property, which may be referred as parasitic properties, ex. parasitic capacitance and parasitic resistor. These parasitic properties may shield or influence the physical property of DUTs and make the measured electrical property of DUT inaccurate. In response to this issue, de-embedding process is usually used in the industry to factored out or extract the parasitic properties in circuit. One method for de-embedding parasitic property involves, for example, analyzing four different DUTs of "short," "load," "open," and "thru" that are fabricated with the same process and in accordance with the same design specifications as the IC devices of interest, in order to obtain actual electric properties of the DUTs.

Although the de-embedding technology is widely used in the industry, it may still encounter some problems in the applications of current some metal-oxide-semiconductor (RF MOS) devices, especially in those ICs using conductive substrate, their high-frequency operation would bring about extremely high parasitic properties that hinder the de-embedding process. For example, ground-signal-ground (GSG) test structure used for DUTs with extremely high frequency always causes high parasitic properties, and these parasitic properties further make the measured electrical properties very sensitive to the process migration of inline process, and may even cause the coupling between two ports of the DUT, which make de-embedding process more difficult and even infeasible. Accordingly those of skilled in the art need to improve current GSG test structures, in order to make them more suitable for the test of devices with extremely high frequency.

SUMMARY OF THE INVENTION

In order to solve the aforementioned issue of parasitic property encountered in electrical test of current radio-frequency (RF) devices, the present invention hereby provides a novel ground-signal-ground (GSG) device structure, featuring the signal pads designedly only in the level of 7th metal layer (M7) or above in back-end-of-line (BEOL) metal layers. With this design, the test will not suffer excessive coupling capacitance between transmission lines and substrate due to the existence of metal layers in lower levels close to device-under-test (DUT), and the measured electrical property of DUTs can be more accurate.

The objective of present invention is to provide a ground-signal-ground (GSG) device structure, including two signal pads aligned in a first direction and two ground pads respectively at two sides of each signal pad in a second direction perpendicular to the first direction, and two transmission lines between the two signal pads and connected respectively with the two signal pads, and the two transmission lines extend toward each other in the first direction and are connected to a device-under-test (DUT), wherein the two signal pads and two transmission lines are only in a level of 7th metal layer or above in back-end-of-line (BEOL) metal layers.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
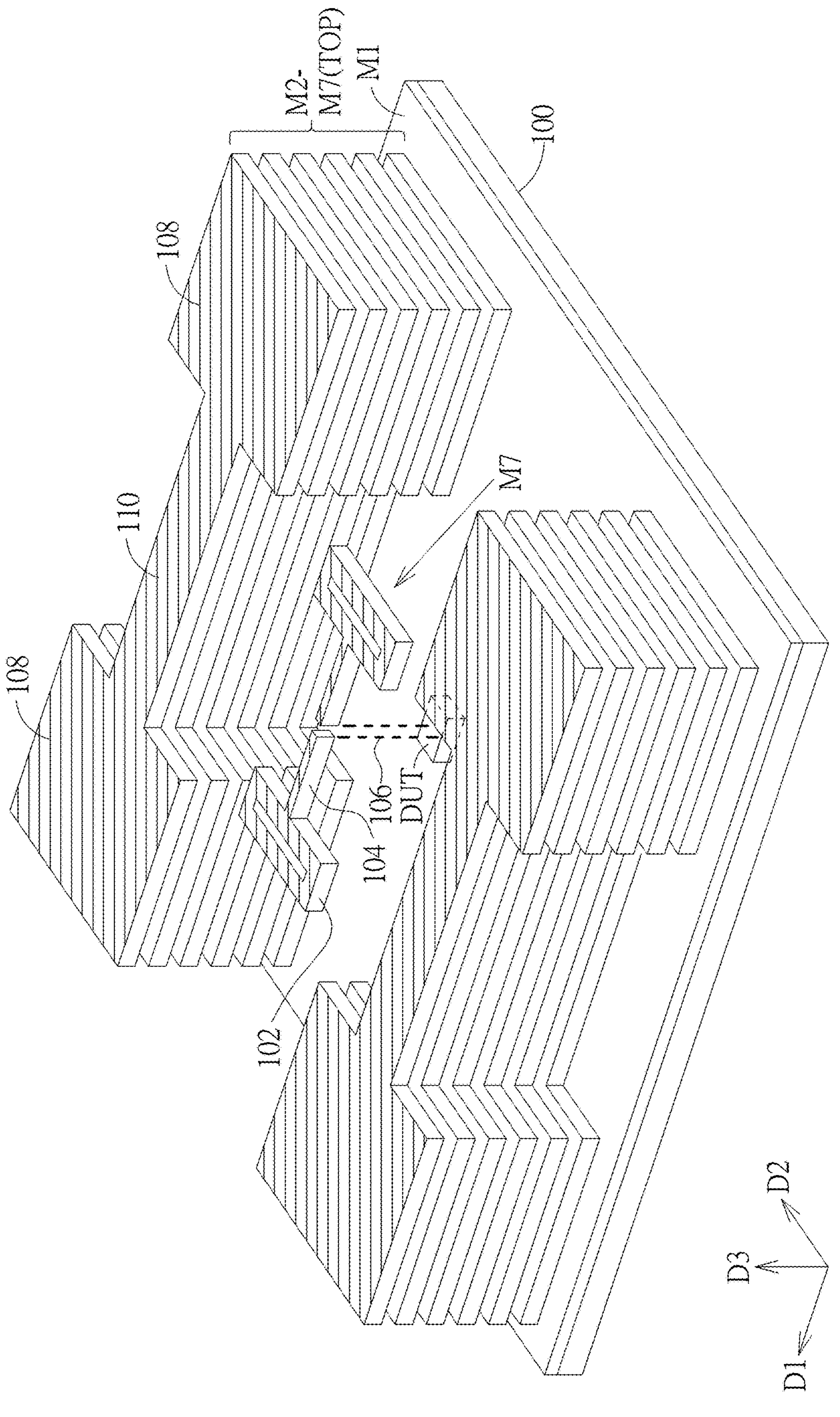
FIG. 1 is a schematic isometric view of a ground-signal-ground (GSG) device structure in accordance with the preferred embodiment of the present invention.

Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

In the following detailed description of the present invention, reference is made to the accompanying drawings which form a part hereof and is shown by way of illustration and specific embodiments in which the invention may be practiced. These embodiments are described in sufficient details to enable those skilled in the art to practice the invention. Other embodiments may be utilized and structural, logical, and electrical changes may be made without departing from the scope of the present invention. The following detailed description, therefore, is not to be taken in a limiting sense, and the scope of the present invention is defined by the appended claims.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). In addition, spatially relative terms, such as "beneath," "below," "lower," "above," "upper," and the like, may be used herein for ease of description to describe one element or feature's relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

Figure 2:
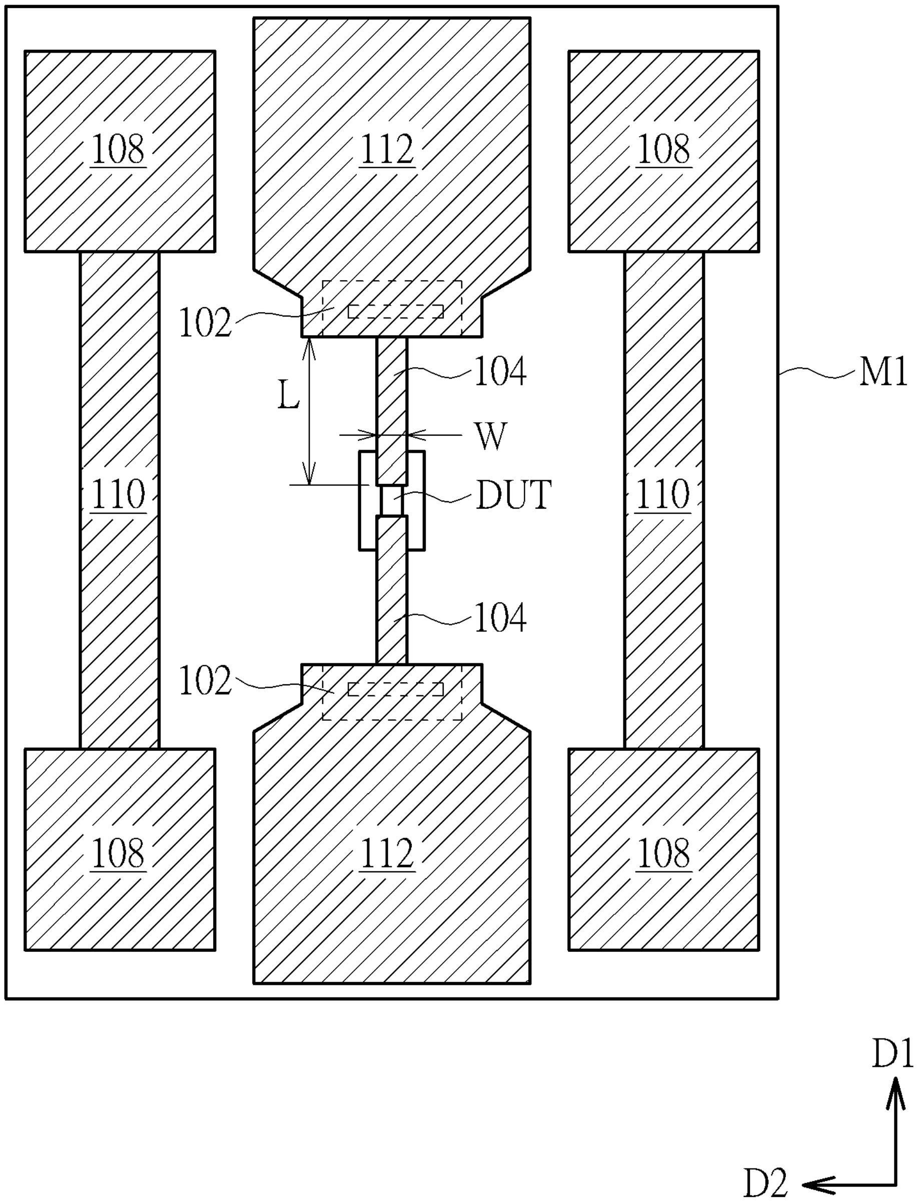
FIG. 2 is a schematic top view of the GSG device structure in accordance with the preferred embodiment of the present invention.

Please now refer collectively to FIG. 1 and FIG. 2, which are schematic isometric view and top view of a ground-signal-ground (GSG) device structure respectively in accordance with the preferred embodiment of present invention. As shown in the figure, the GSG device structure is set on a substrate 100, ex. a silicon substrate. A device-under-test (DUT), ex. transistor, amplifier, resistor, capacitor or radio-frequency metal-oxide-semiconductor (RF MOS) device, is set on a substrate 100. Multiple back-end-of-line (BEOL) metal layers, ex. 1st metal layer (M1) to 7th metal layer (M7, top metal layer) are further included above the substrate 100. Please note that structures like dielectric layers and vias between these BEOL metal layers are not shown in the figures of present invention for the conciseness of drawings.

In the preferred embodiment of present invention, two signal pads 102 are set in the 7th metal layer (M7) in these BEOL metal layers. Two signal pads 102 are aligned in a first direction D1 and are provided respectively with one transmission lines 104 connected therewith, preferably connected with the center of the side in a second direction D2 of corresponding signal pad 102, wherein the second direction D2 is preferably perpendicular to the first direction D1. The two transmission lines 104 are also in the 7th metal layer (M7) and extend toward each other in the first direction D1 until close to the symmetrical center of two signal pads 102 and two transmission lines 104. The ends of two transmission lines 104 are electrically connected to the DUT on the substrate 100 through vias in underlying layers. In the embodiment of present invention, the DUT may be active or passive RF MOS device with extremely high frequency, for example mmWave device with operating frequency between 30-300 GHz, and the transmission lines 104 used for these devices may be hollow metal transmission line with coplanar waveguide (CPW) property. The length L of transmission line 104 in the first direction D1 may be between 10-20 μm, and the width W of transmission line 104 in the second direction D2 may be equal to or smaller than 2.5 μm. In order to measure the intrinsic electrical property of these devices for modeling their performance when embedded in IC design device environment and operated in GHz-level high frequency, the measured value must be de-embedded to remove the influence of parasitic property resulted from test circuits.

Refer still to FIG. 1 and FIG. 2. Ground pads 108, ex. probe pads, are set respectively at two sides of each signal pad 102 in the second direction D2. A connecting line 110 is provided and connected between two ground pads 108 (i.e. at the same side of signal pads 102) in the first direction D1. Please note that in the preferred embodiment of present invention, the ground pads 108 and connecting lines 110 are generally in every level of the BEOL metal layers except the 1st metal layer (M1), i.e. in metal layers M2-M7, and in a topmost redistribution layer (RDL, not shown), and their patterns may be completely overlapped in a vertical direction D3, with patterns in every level may be electrically connected through multiple vias (not shown), while bottommost ground pattern may be grounded with the substrate 100 through contacts. The DUT may also be connected with ground pads 108 through substrate 100 or conductive lines. In comparison to the features above, the signal pads 102 and transmission line 104 in the structure of present invention are only in the 7th metal layer (M7) of BEOL metal layers, and their patterns will not exist in the 2nd metal layer (M2) to 6th metal layer (M6) below.

Furthermore, in addition to the ground pads 108 in the embodiment of present invention, GSG device structure is further provided with two test pads 112 (FIG. 2), ex. probe pads, in the redistribution layer, which are between the two ground pads 108 in the second direction D2 and connected respectively to corresponding signal pads 102. In another aspect, the 1st metal layer (M1) in BEOL metal layers function as a shield layer between the substrate 100 (including the DUT thereon) and the BEOL metal layers (M2) above, and only the position close to the DUT are provided with openings for the connecting vias 106 to extend therethrough, so that the electromagnetic interference in the operation of high-frequency RF MOS device may be effectively shielded. In actual GSG electrical test, external measurement tool will contact the aforementioned test pads 112 and ground pads 108 in the redistribution layer through microprobes to output signals to DUT for testing various responses and electrical parameters of the DUT, and de-embedding process will be performed according to the measurement result.

In comparison to signal pads and transmission lines in GSG device structure of conventional skills, as shown in FIG. 1 according to the description of embodiment above, the semiconductor BEOL levels in the design of present invention will not be provided with unnecessary metal layers of signal pad (only having vias 106 for connecting the DUT), thereby avoiding the problem of excessive coupling capacitance between the transmission lines and substrate, and the intrinsic electrical property measured in the test may be more accurate in order to facilitate the de-embedding process. Furthermore, the ends of transmission line 104 in the embodiment of present invention will not be provided with other extending structures like T-bar commonly used in conventional skills. Instead, they are connected directly to the DUT below through vias 106, which may further reduce the coupling capacitance resulted from this kind of extending structures.

Figure 3:
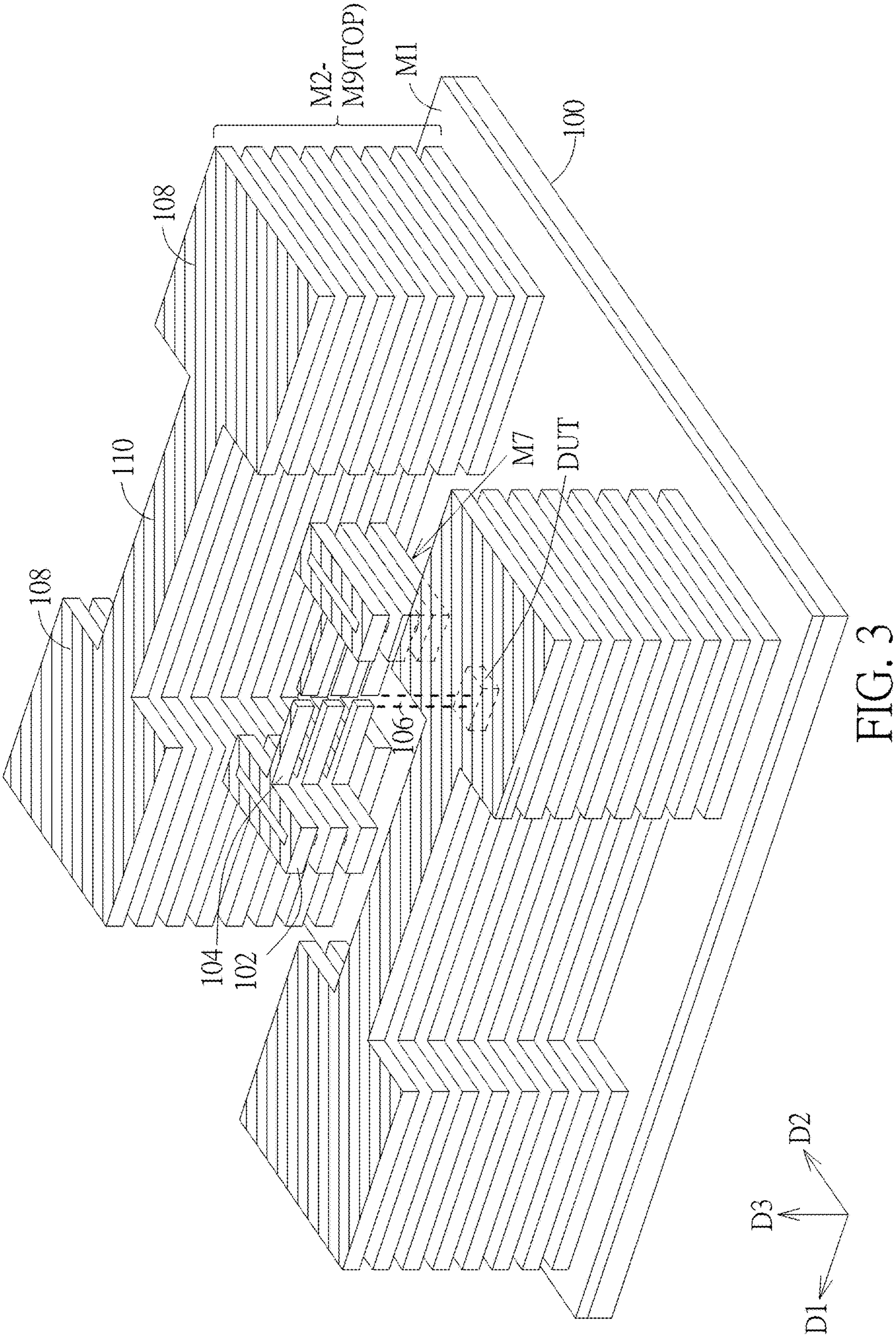
FIG. 3 is a schematic isometric view of a GSG device structure in accordance with another embodiment of the present invention.

Please now refer to FIG. 3, which is a schematic isometric view in accordance with another embodiment of the present invention. The structure of this embodiment is similar to the one shown in FIG. 1, with difference that the signal pads 102 and transmission lines 104 of GSG device structure in this embodiment is in every level of the BEOL metal layers from the 7th metal layer (M7) to top metal layer (M9/TOP). Patterns of signal pads 102 and transmission lines 104 in these levels may be completely overlapped in the vertical direction D3, and the patterns in every level may be electrically connected through multiple vias (not shown) and be connected with the test pads 112 in the topmost redistribution layer.

In the embodiment of present invention, the material of structures like signal pads 102, transmission lines 104, ground pads 108, connecting lines 110 in the BEOL metal layers may be copper (Cu), aluminum (Al) or the alloy thereof. The material of structures like test pads 112, ground pads 108, connecting lines 110 in the redistribution layer may be aluminum (Al), and the material of vias may be copper (Cu), aluminum (Al), tungsten (W) or the alloy thereof, but not limited thereto. The dielectric material between metal layers may be silicon oxide, silicon nitride, fluorosilicate glass (FSG), low-k dielectrics, SILK or the combination thereof, preferably FSG and low-k dielectrics.

According to the aforementioned embodiment, the approach of designedly setting signal pads and transmission lines only in the level of 7th metal layer (M7) or above in the BEOL metal layers solve the problems of unnecessary patterns of signal pad and excessive coupling capacitance between the transmission lines and substrate, so that the measured electrical property of DUT may be more accurate, suitable for the electrical test of RF MOS devices operated in extremely high frequency or mmWAVE band, which is an invention both with novelty and non-obviousness.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A ground-signal-ground (GSG) device structure, comprising:

two signal pads aligned in a first direction and two ground pads provided respectively at two sides of each said signal pad in a second direction perpendicular to said first direction; and two transmission lines between said two signal pads and connected and integrated respectively with said two signal pads in a same metal layer, wherein a width of each of said transmission line in said second direction is smaller than a width of each of said signal pad in said second direction, and said two transmission lines extend toward each other in said first direction and are connected to a device;

wherein said same metal layer is only in a level of 7th metal layer (M7) or above in back-end-of-line (BEOL) metal layers of a semiconductor IC die, and said BEOL metal layers comprises metal layers from a 1st metal layer (M1) to said 7th metal layer (M7), and a numbering of said metal layers in said back-end-of-line (BEOL) metal layers begins at said 1st metal layer (M1), and said two signal pads are further connected respectively to two test pads in a redistribution layer (RDL) above said BEOL metal layers.

2. The GSG device structure of claim 1, wherein patterns of said two signal pads and said two transmission lines are in every level of said BEOL metal layers from said 7th metal layer (M7) to a top metal layer (TM).

3. The GSG device structure of claim 2, wherein said patterns of said signal pads and said transmission lines in said every level are completely aligned in a vertical direction.

4. The GSG device structure of claim 1, two of said ground pads at the same side of said two signal pads are connected through a connecting line.

5. The GSG device structure of claim 4, wherein said ground pads and said connecting lines are in every level except said 1st metal layer (M1) of said BEOL metal layers and are completely aligned in a vertical direction.

6. The GSG device structure of claim 1, wherein said two transmission lines are connected to said device on a substrate through vias.

7. The GSG device structure of claim 6, wherein said two signal pads and said two transmission lines do not overlap any metal layers below said 7th metal layer (M7) except said vias and a shield layer.

8. The GSG device structure of claim 1, further comprising a shield layer in said 1st metal layer (M1) in said BEOL metal layers.

9. The GSG device structure of claim 1, wherein a length of said transmission lines in said first direction is between 10-20 μm, and a width of said transmission lines in said second direction is equal to or smaller than 2.5 μm.

* * * * *